(12) United States Patent
Wang

(10) Patent No.: US 10,720,609 B2
(45) Date of Patent: Jul. 21, 2020

(54) DISPLAY SUBSTRATE AND MANUFACTURING METHOD THEREOF, DISPLAY DEVICE AND MANUFACTURING METHOD THEREOF

(71) Applicant: BOE Technology Group Co., Ltd., Beijing (CN)

(72) Inventor: Ming Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/192,309

(22) Filed: Nov. 15, 2018

(65) Prior Publication Data

US 2019/0157629 A1 May 23, 2019

(30) Foreign Application Priority Data

Nov. 21, 2017 (CN) .......................... 2017 1 1165973

(51) Int. Cl.
*H01L 51/56* (2006.01)
*H01L 27/32* (2006.01)
*H01L 51/52* (2006.01)

(52) U.S. Cl.
CPC .......... *H01L 51/56* (2013.01); *H01L 27/3246* (2013.01); *H01L 27/3258* (2013.01);
(Continued)

(58) Field of Classification Search
CPC . H01L 51/5284; H01L 51/5221; H01L 51/56; H01L 27/3258; H01L 51/5268; H01L 29/78633
See application file for complete search history.

(56) References Cited

U.S. PATENT DOCUMENTS 8,067,775 B2 11/2011 Miyairi et al.
9,030,619 B2 5/2015 Murai et al.
(Continued)

FOREIGN PATENT DOCUMENTS

CN 102386236 A 3/2012
CN 103261959 A 8/2013
(Continued)

OTHER PUBLICATIONS

First Office Action dated Nov. 1, 2019 for corresponding Chinese application 201711165973.0.

*Primary Examiner* — Caridad Everhart
(74) *Attorney, Agent, or Firm* — Nath, Goldberg & Meyer; Joshua B. Goldberg

(57) ABSTRACT

A display substrate including: a base substrate; a thin film transistor provided on a side of the base substrate; a planarization layer provided on a side of the thin film transistor away from the base substrate; a pixel defining layer provided on a side of the planarization layer away from the base substrate, defining a plurality of pixel regions arranged in a matrix, an orthographic projection of the pixel defining layer on the base substrate covering an orthographic projection of the thin film transistor on the base substrate; an organic light emitting diode provided in the pixel region, a recess being provided at a side of the planarization layer away from the base substrate, located at a boundary between the pixel defining layer and the pixel region and located between the thin film transistor and the organic light emitting diode, and a light blocking structure being provided in the recess.

20 Claims, 3 Drawing Sheets

(52) U.S. Cl.
CPC ...... *H01L 27/3262* (2013.01); *H01L 27/3272* (2013.01); *H01L 51/5206* (2013.01); *H01L 51/5221* (2013.01); *H01L 51/5284* (2013.01)

(56) References Cited

U.S. PATENT DOCUMENTS

| | | |
|---|---|---|
| 9,618,801 B2 | 4/2017 | Jang et al. |
| 10,347,532 B2 | 7/2019 | Xu et al. |
| 2009/0039773 A1* | 2/2009 | Jun ............... H01L 27/3246 313/504 |
| 2014/0361265 A1* | 12/2014 | Liu ............... H01L 51/5271 257/40 |
| 2016/0359054 A1 | 12/2016 | Fang et al. |
| 2018/0083218 A1* | 3/2018 | Choi ............. H01L 51/5203 |
| 2019/0013371 A1* | 1/2019 | Kim ............. H01L 27/3246 |
| 2019/0214442 A1* | 7/2019 | Liu ............... H01L 27/3246 |

FOREIGN PATENT DOCUMENTS

| | | |
|---|---|---|
| CN | 103296090 A | 9/2013 |
| CN | 104600081 A | 5/2015 |
| CN | 105097831 A | 11/2015 |
| CN | 105988256 A | 10/2016 |
| CN | 107039352 A | 8/2017 |

* cited by examiner

DISPLAY SUBSTRATE AND MANUFACTURING METHOD THEREOF, DISPLAY DEVICE AND MANUFACTURING METHOD THEREOF

CROSS-REFERENCE TO RELATED APPLICATIONS

The present disclosure claims priority to Chinese Patent Application No. 201711165973.0, filed on Nov. 21, 2017, the disclosure of which is incorporated herein by reference.

TECHNICAL FIELD

The present disclosure relates to the field of display technologies, and in particular, to a display substrate and a manufacturing method thereof, a display device and a manufacturing method thereof.

BACKGROUND

Organic Light-Emitting Diode (OLED) display technology is widely used in mobile phones, digital cameras, laptops, car stereos and TVs, etc. due to its advantageous such as high visibility, high brightness, low voltage requirements, high power saving efficiency, fast response, light weight, thin thickness and so on.

SUMMARY

The present disclosure provides a display substrate including: a base substrate; a thin film transistor provided on a side of the base substrate; a planarization layer provided on a side of the thin film transistor away from the base substrate; a pixel defining layer provided on a side of the planarization layer away from the base substrate, defining a plurality of pixel regions arranged in a matrix, an orthographic projection of the pixel defining layer on the base substrate covering an orthographic projection of the thin film transistor on the base substrate; a light emitting diode provided in the pixel region, a recess being provided at a side of the planarization layer away from the base substrate, the recess being located at a boundary between the pixel defining layer and the pixel region, and the recess being located between the thin film transistor and the light emitting diode, and a light blocking structure being provided in the recess.

In some implementations, the recess is provided continuously or discontinuously around the pixel region.

In some implementations, the light blocking structure includes a light blocking material, the light blocking material being filled in the recess.

In some implementations, the light emitting diode includes an anode layer, a light emitting layer, and a cathode layer, the anode layer is provided on a side of the planarization layer away from the base substrate, the light emitting layer is provided on a side of the anode layer away from the base substrate, and the cathode layer is provided on a side of the light emitting layer away from the base substrate.

In some implementations, the light emitting layer further covers a surface of the recess; and the cathode layer is provided on an entire surface of the light emitting layer; and the light blocking structure is formed by a portion of the cathode layer located in the recess.

In some implementations, a surface of the light blocking material exposed from the recess is flush with a surface of the planarization layer away from the base substrate.

In some implementations, the light emitting diode includes an anode layer, a light emitting layer, and a cathode layer, the anode layer is provided on a side of the planarization layer away from the base substrate, the light emitting layer is provided on a side of the anode layer away from the base substrate, and the cathode layer is provided on a side of the light emitting layer away from the base substrate, and the anode layer covers a surface of the planarization layer away from the base substrate and a surface of the light blocking material exposed from the recess.

In some implementations, the thin film transistor is a switching transistor, and an active layer of the switching transistor is made of an indium gallium zinc oxide material.

The present disclosure provides a manufacturing method of a display substrate, including steps of: providing a base substrate; forming a thin film transistor on a side of the base substrate; forming a planarization layer on a side of the base substrate on which the thin film transistor has been formed; forming a recess at a side of the planarization layer away from the base substrate; forming a light blocking structure in the recess; forming a pixel defining layer on the planarization layer, the pixel defining layer defining a plurality of pixel regions; forming a light emitting diode on a side of the planarization layer in the pixel region away from the base substrate, an orthographic projection of the pixel defining layer on the base substrate covers an orthographic projection of the thin film transistor on the base substrate, the recess is formed at a boundary between the pixel defining layer and the pixel region, and the recess is located between the thin film transistor and the light emitting diode.

In some implementations, the step of forming the recess at the side of the planarization layer away from the base substrate includes: forming the recess that is continuously or discontinuously around the pixel region at the side of the planarization layer away from the base substrate.

In some implementations, the step of forming the planarization layer on the side of the base substrate on which the thin film transistor has been formed includes: forming an entire film layer for the planarization film layer on the side of the base substrate on which the thin film transistor has been formed; performing a patterning process on the entire film layer for the planarization layer by using a halftone mask to form a patterned planarization layer. The step of forming the recess at the side of the planarization layer away from the base substrate includes: performing a patterning process on the patterned planarization layer by using a halftone mask to form the recess.

In some implementations, the step of forming the light emitting diode on the side of the pixel region away from the base substrate in the pixel region further includes: forming an anode layer on a side of the planarization layer away from the base substrate; forming a light emitting layer on a side of the anode layer away from the base substrate; forming a cathode layer on a side of the light emitting layer away from the base substrate.

In some implementations, the step of forming the light blocking structure in the recess includes: forming the light emitting layer on a surface of the recess; forming a cathode layer on a side of the light emitting layer in the recess away from the base substrate.

In some implementations, the step of forming the light blocking structure in the recess includes: filling a light blocking material in the recess to form the recess, a surface of the light blocking material exposed from the recess is flush with a surface of the planarization layer away from the base substrate, and the step of forming the anode layer on the side of the planarization layer away from the base substrate further includes: forming the anode layer to cover a surface of the planarization layer away from the base substrate and a surface of the light blocking material exposed from the recess.

The present disclosure provides a display device including the above display substrate.

The present disclosure provides a manufacturing method of a display device, including the above manufacturing method of the display substrate.

DETAILED DESCRIPTION

In order to enable those skilled in the art to better understand the technical solutions of the present disclosure, a display substrate and a manufacturing method thereof, a display device and a manufacturing method thereof provided by the present disclosure will be described in detail below with reference to the accompanying drawings.

A related OLED display device usually uses an oxide semiconductor thin film transistor (Oxide Semiconductor TFT) as a switching transistor, but since the oxide semiconductor thin film transistor is easily affected by light, in a case where the switching transistor is applied with a negative voltage and is irradiated by light from a light emitting diode for a long time, a threshold voltage (Vth) of the thin film transistor is likely to be negatively drifted, and in severe cases, the thin film transistor may be unable to work normally.

Figure 1:
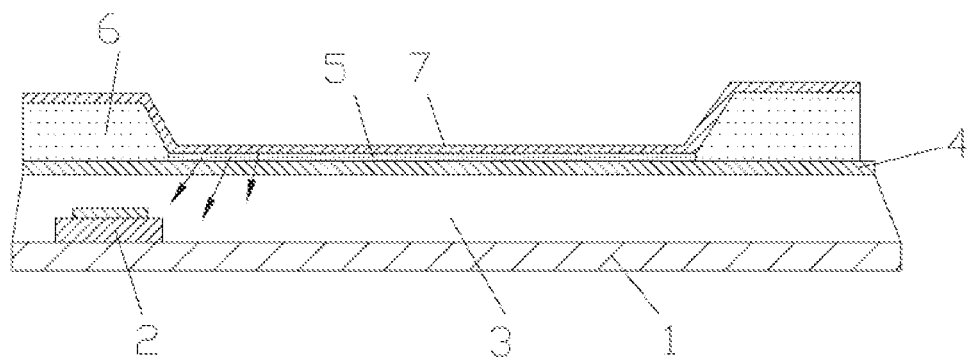
FIG. 1 is a cross-sectional view of a related display substrate.

FIG. 1 is a cross-sectional view of a related display substrate. FIG. 1 shows only one pixel structure of the display substrate. As shown in FIG. 1, the display substrate includes a thin film transistor 2, a planarization layer 3, an anode layer 4, a pixel defining layer 6, a light emitting layer 5 and a cathode layer 7, which are sequentially provided in a direction away from the substrate 1. Portions of the anode layer 4, the light emitting layer 5 and the cathode layer 7 which are adjacently provided in a region defined by the pixel defining layer 6 constitute an organic light emitting diode.

It should be noted that the above constituting an organic light emitting diode is just illustrative, but not limited, and constituting an inorganic light emitting diode is also possible.

The thin film transistor 2 generally employs an oxide semiconductor thin film transistor, but since the oxide semiconductor thin film transistor (including an active layer made of an IGZO material) is easily affected by light, in a case where the thin film transistor 2 is applied with a negative voltage and is irradiated by light emitted from the light emitting layer 5 for a long time, the threshold voltage (Vth) of the thin film transistor is likely to be negatively drifted, and in severe cases, the thin film transistor may be unable to work normally. From experimental test data, when the negative drift of the threshold voltage reaches a range from −7V to −8V, the thin film transistor will be unable to work normally.

Figure 2:
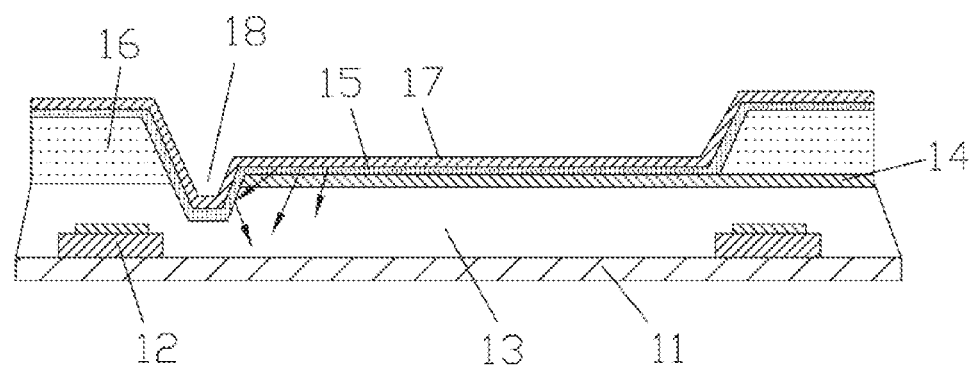
FIG. 2 is a cross-sectional view of a display substrate according to an embodiment of the present disclosure.
Figure 3:
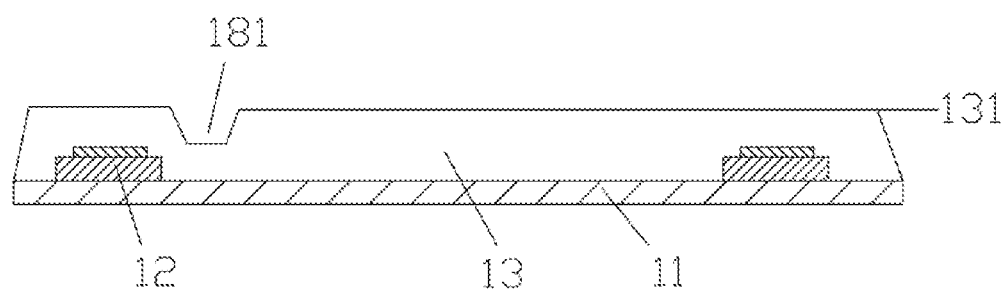
FIG. 3 is a cross-sectional view of a planarization layer employed in an embodiment of the present disclosure.

In view of above, an embodiment of the present disclosure provides a display substrate, as shown in FIG. 2 and FIG. 3, which includes a base substrate 11 and a plurality of pixel structures, FIG. 2 shows only one pixel structure. As shown in FIGS. 2 and 3, the display substrate in this embodiment includes a thin film transistor 12, a planarization layer 13, an anode layer 14, a pixel defining layer 16, a light emitting layer 15 and a cathode layer 17, which are sequentially provided in a direction away from the base substrate 11. Portions of the anode layer 14, the light-emitting layer 15 and the cathode layer 17 which are adjacently provided in a region defined by the pixel defining layer 16 constitute an organic light emitting diode. Further, a recess 181 is provided at a side of the planarization layer 13 away from the base substrate, and the recess 181 is provided with a light blocking structure 18 therein, and is provided adjacent to the thin film transistor 12 for blocking at least part of light emitted by the organic light emitting diode from being irradiated on the thin film transistor 12.

With the light blocking structure 18 described above, the influence of light irradiation on the thin film transistor 12 can be reduced, so that the negative drift of the thin film transistor can be improved and the thin film transistor can be prevented from being unable to work normally.

In the present embodiment, as shown in FIG. 2, the anode layer 14 is provided on the planarization layer 13 and at a side of the recess 181; the light emitting layer 15 covers a portion of the anode layer 14 located in the region defined by the pixel defining layer 16, the surface of the recess 181, a side surface of the pixel defining layer 16 adjacent to the recess 181, and an entire surface of the pixel defining layer 16 away from the base substrate 11; the cathode layer 17 covers an entire surface of the light emitting layer 15 away from the base substrate 11, such that a portion of the cathode layer 17 covers the light emitting layer 15 in the recess 181. Since the cathode layer 17 is usually made of a light-tight material such as metal Al, a portion of the cathode layer 17 corresponding to the surface of the recess 181 can be used as the above-described light blocking structure 18. As shown by the arrows in FIG. 2, the light blocking structure 18 can reflect light irradiated thereon, thereby reducing the amount of light directly irradiated to the thin film transistor 12.

In addition, by using the portion of the cathode layer 17 corresponding to the surface of the recess 181 as a light blocking layer, while manufactures of the cathode layer 17 and the light emitting layer 15 are completed, manufacturing of the light blocking structure 18 can be completed without increasing the number of process steps, thereby ensuring that the complexity of the process cannot be increased.

Further, by covering the surface of the recess 181 with the light emitting layer the cathode layer 17 can be isolated from the anode layer 14 to prevent short-circuiting between the cathode layer 17 and the anode layer 14 due to contact therebetween.

In some embodiments, the recess 181 is a groove having a slope, that is, as shown in FIG. 3, the illustrated cross section of the recess 181 is trapezoidal, which is more advantageous for the completion of an exposure process.

Certainly, in practical applications, the recess 181 may also adopt any other structure of the groove, which is not limited in the present disclosure.

Furthermore, a depth of the recess 181 can be freely set according to a desired light-blocking effect, but the depth of the recess 181 should not be too deep while ensuring the light blocking effect, so as to avoid the problem that the aperture ratio is too low.

Figure 4:
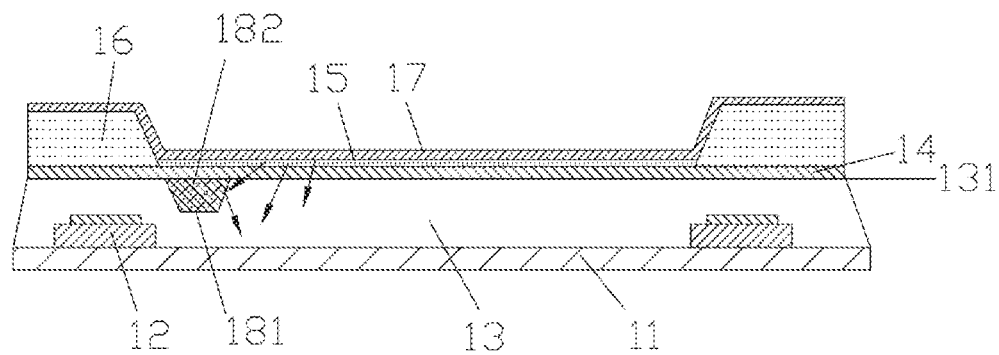
FIG. 4 is a cross-sectional view of a display substrate according to an embodiment of the present disclosure.

FIG. 4 is a cross-sectional view of a display substrate provided by an embodiment of the present disclosure. As shown in FIG. 4, the display substrate provided by the embodiment of the present disclosure is substantially the same as the display substrate provided by the above embodiment, except that structures of the light blocking structure are different. Hereinafter, differences between the two embodiments will be described in detail.

Specifically, the light blocking structure in this embodiment includes a light blocking material 182 that is filled in the recess 181. With the light blocking material 182, the light irradiated thereto can be reflected, thereby reducing the amount of light directly irradiated to the thin film transistor 12.

In some embodiments, the surface of the light blocking material 182 exposed from the recess 181 is flush with the surface 131 of the planarization layer 13 away from the base substrate 11, that is, the light blocking material 182 fills the recess 181 to make the surface 131 of planarization layer 13 away from the base substrate 11 be restored to a continuous plane. In this case, the anode layer 14 may directly cover the entire surface of the planarization layer 13 away from the base substrate 11, that is, cover the surface 131 of the planarization layer 13 away from the base substrate 11 and the surface of the light blocking material 182 exposed from the recess 181. Furthermore, the light emitting layer 15 is provided on the anode layer 14 and the cathode layer 17 is provided on the light emitting layer 15.

Certainly, in practical applications, the light blocking material 182 may also partially fill the recess 181 as long as it can at least partially reduce the amount of light directly irradiated to the thin film transistor 12.

Figure 5:
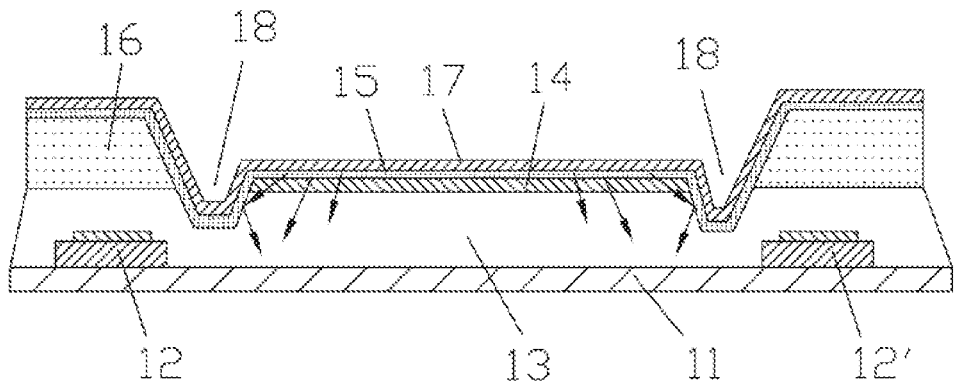
FIG. 5 is a cross-sectional view of a display substrate according to an embodiment of the present disclosure.

FIG. 5 is a cross-sectional view of a display substrate according to an embodiment of the present disclosure. As shown in FIG. 5, the display substrate provided by the embodiment is substantially the same as the display substrate provided by the above embodiment, except that the structures of the light blocking structures are different. Hereinafter, differences between the two embodiments will be described in detail.

Specifically, in this embodiment, two recesses 181 are provided in each pixel structure, a first recess is provided at an end of the light emitting diode and between the thin film transistor and the light emitting diode in the pixel structure, and the light blocking structure 18 in the first recess is used to protect the thin film transistor 12 in the pixel structure in which the first recess is located; and a second recess is provided at another end of the light emitting diode, and a light blocking structure 18 in the second recess is used to protect a thin film transistor 12' in a pixel structure adjacent to the pixel structure in which the second recess is located. For example, the light blocking structure 18 on the left side shown in FIG. 5 protects the thin film transistor 12 in the pixel structure in which the light blocking structure 18 is located; the light blocking structure 18 at the right side shown in FIG. 5 protects the thin film transistor 12' in a right adjacent pixel structure. In this way, the influence of light irradiation from an adjacent pixel structure on the thin film transistor can be reduced, thereby further improving the negative drift of the thin film transistor and avoiding the thin film transistor from being unable to work normally.

Figure 6:
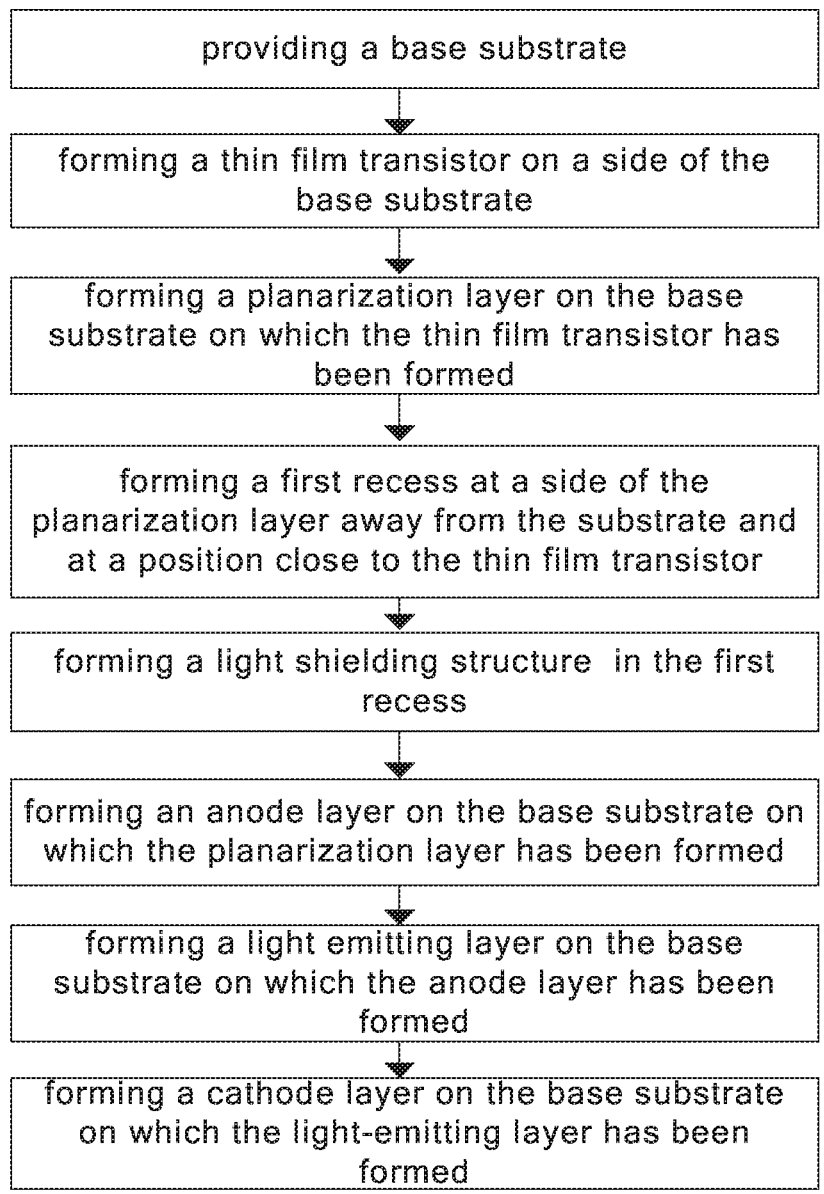
FIG. 6 is a flowchart of a manufacturing method of a display substrate according to an embodiment of the present disclosure.

An embodiment of the present disclosure provides a manufacturing method of a display substrate, as shown in FIG. 6, the manufacturing method includes the following steps: providing a base substrate 11; forming a thin film transistor 12 on a side of the base substrate 11; forming a planarization layer 13 on the base substrate 11 on which the thin film transistor 12 has been formed; forming a first recess at a side of the planarization layer 13 away from the substrate and at a position close to the thin film transistor 12; forming a light blocking structure 18 in the first recess; forming an anode layer 14 on the base substrate 11 on which the planarization layer 13 has been formed; forming a light emitting layer 15 on the base substrate 11 on which the anode layer 14 has been formed; and forming a cathode layer 17 on the base substrate 11 on which the light-emitting layer 15 has been formed, the anode layer 14, the light emitting layer 15 and the cathode layer 17 which are adjacently provided constitute an organic light emitting diode, the thin film transistor 12 is formed at an end of the light emitting diode, the light blocking structure 18 is configured to block at least part of light emitted by the organic light emitting diode from irradiating to the thin film transistor 12, the influence of light irradiation on the thin film transistor 12 can be reduced, so that the negative drift of the thin film transistor can be improved and the thin film transistor can be prevented from being unable to work normally.

Since the specific structures of the above mentioned light blocking structure 18 has been described in detail in the above embodiments, it will not be described herein, and the above embodiments are described by taking one pixel unit as an example.

Furthermore, in an embodiment of the present invention, there is provided yet another manufacturing method of a display substrate, the method being different from the foregoing manufacturing method in that: in this embodiment, the step of forming the first recess on the side of the planarization layer 13 away from the base substrate includes: in each pixel, a second recess is formed at a side of the planarization layer 13 away from the base substrate, the second recess is formed at another end of the light emitting diode, and the step of forming the light blocking structure 18 in the first recess further includes: forming the light blocking structure 18 in the second recess.

In some embodiments, as shown in FIG. 2, the step of forming the light blocking structure in the first recess includes: forming the light emitting layer 15 on a surface of the first recess; and forming the cathode layer 17 on the light emitting layer 15 in the first recess.

In some embodiments, as shown in FIG. 5, the step of forming the light blocking structure 18 in the first recess includes: forming the light emitting layer 15 on a surface of the first recess; forming the cathode layer 17 on the light emitting layer 15 in the first recess. The step of forming the light blocking structure 18 in the second recess includes: forming a light emitting layer 15 on a surface of the second recess; forming a cathode layer 17 on the light emitting layer 15 in the second recess.

Figure 7:
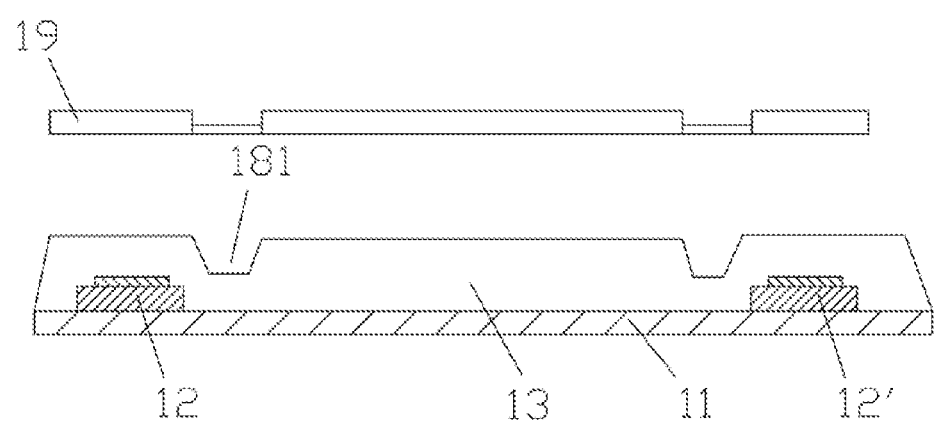
FIG. 7 is a diagram illustrating procedures in which a halftone mask is used in a manufacturing method of a display substrate according to an embodiment of the present disclosure.

As shown in FIG. 7, the step of forming the planarization layer 13 on the base substrate 11 on which the thin film transistor 12 has been formed specifically includes: forming an entire film layer for the planarization layer 13 on the base substrate 11 on which the thin film transistor 12 has been formed; performing a patterning process on the entire film layer for the planarization layer 13 by using a halftone mask 19 to form a patterned planarization layer 13. The step of forming the first recess at the side of the planarization layer away from the base substrate and at the position close to the thin film transistor 12 further includes: performing a patterning process on the patterned planarization layer 13 by using a halftone mask 19 to form the first recess.

With the halftone mask 19, the patterned planarization layer 13 and the light blocking structure 18 can be sequentially formed by two mask processes, one exposure process can be saved, thereby improving the process efficiency.

Certainly, although the above embodiment has been described by taking the first recess and the second recess and the light emitting layers and the cathode layers formed in the first recess and the second recess shown in FIG. 5 as an example, in some embodiments, it can be implemented in a same manner in which the first recess and the second recess may be formed and the light blocking materials may be filled in the first recess and the second recess as that shown in FIG. 4. In this case, the light blocking materials may be formed such that surfaces thereof exposed from the first recess and the second recess are flush with the surface of the planarization layer away from the base substrate, that is, the light blocking materials fill the first recess and the second recess so that the surface of the planarization layer away from the base substrate becomes a continuous plane. Then, the anode layer may directly cover the entire surface of the planarization layer away from the base substrate, that is, cover the surface of the planarization layer away from the base substrate and the surfaces of the light blocking materials exposed from the first recess and the second recess. Furthermore, a light emitting layer is further formed on the anode layer, and a cathode layer 17 is formed on the light emitting layer.

Further, although in this embodiment, description has been made by taking the first recess and the second recess as an example with reference to FIG. 5, the present invention is not limited thereto, and for example, a continuous or discontinuous recess may be formed around the pixel region. The cross-sectional view of the recess formed in this case is the same as that shown in FIG. 5. In other words, the form of the recess is not limited as long as the recess can block the light emitted from the light emitting diode from being irradiated to the thin film transistor.

As another technical solution, the present disclosure also provides a display device including the display substrate provided by the above various embodiments of the present disclosure.

The display device provided by the present disclosure can reduce the influence of light irradiation on the thin film transistor by using the display substrate provided by the above various embodiments of the present disclosure, thereby improving the negative drift of the thin film transistor and avoiding the thin film transistor being unable to work normally.

As another technical solution, the present disclosure further provides a manufacturing method of a display device, which includes a manufacturing method of a display substrate provided by the above embodiment of the present disclosure.

The manufacturing method of the display device provided by the present disclosure can reduce the influence of light irradiation on the thin film transistor by using the manufacturing method of the display substrate provided by the present disclosure, thereby improving the negative drift of the thin film transistor and avoiding the thin film transistor being unable to work normally.

It should be understood that, the foregoing embodiments are only exemplary embodiments used for explaining the principle of the present disclosure, but the present disclosure is not limited thereto. Various variations and improvements may be made by a person skilled in the art without departing from the spirit and essence of the present disclosure, and these variations and improvements also fall into the protection scope of the present disclosure.

The invention claimed is:

1. A display substrate, comprising:
   a base substrate;
   a thin film transistor provided on a side of the base substrate;
   a planarization layer provided on a side of the thin film transistor away from the base substrate;
   a pixel defining layer provided on a side of the planarization layer away from the base substrate, defining a plurality of pixel regions arranged in a matrix, an orthographic projection of the pixel defining layer on the base substrate covering an orthographic projection of the thin film transistor on the base substrate;
   a light emitting diode provided in a pixel region,
   wherein a recess being provided at a side of the planarization layer away from the base substrate, the recess being located at a boundary between the pixel defining layer and the pixel region, and the recess being located between the thin film transistor and the light emitting diode in a direction parallel to the base substrate, and
   a light blocking structure being provided in the recess and configured to at least block light emitted from the light emitting diode from irradiating onto the thin film transistor.

2. The display substrate according to claim 1, wherein the thin film transistor is a switching transistor, and an active layer of the switching transistor is made of an indium gallium zinc oxide material.

3. A display device comprising the display substrate of claim 1.

4. The display substrate according to claim 1, wherein the recess is provided continuously or discontinuously around the pixel region.

5. The display substrate according to claim 4, wherein the thin film transistor is a switching transistor, and an active layer of the switching transistor is made of an indium gallium zinc oxide material.

6. The display substrate according to claim 4, wherein the light blocking structure comprises a light blocking material, the light blocking material being filled in the recess.

7. The display substrate according to claim 6, wherein a surface of the light blocking material exposed from the recess is flush with a surface of the planarization layer away from the base substrate.

8. The display substrate of claim 7, wherein the light emitting diode comprises an anode layer, a light emitting layer, and a cathode layer, the anode layer is provided on a side of the planarization layer away from the base substrate, the light emitting layer is provided on a side of the anode layer away from the base substrate, and the cathode layer is provided on a side of the light emitting layer away from the base substrate, and
the anode layer covers a surface of the planarization layer away from the base substrate and a surface of the light blocking material exposed from the recess.

9. The display substrate according to claim 1, wherein the light blocking structure comprises a light blocking material, the light blocking material being filled in the recess.

10. The display substrate according to claim 9, wherein a surface of the light blocking material exposed from the recess is flush with a surface of the planarization layer away from the base substrate.

11. The display substrate according to claim 10, wherein the light emitting diode comprises an anode layer, a light emitting layer, and a cathode layer, the anode layer is provided on a side of the planarization layer away from the base substrate, the light emitting layer is provided on a side of the anode layer away from the base substrate, and the cathode layer is provided on a side of the light emitting layer away from the base substrate, and
the anode layer covers a surface of the planarization layer away from the base substrate and a surface of the light blocking material exposed from the recess.

12. The display substrate according to claim 1, wherein the light emitting diode comprises an anode layer, a light emitting layer, and a cathode layer, the anode layer is provided on a side of the planarization layer away from the base substrate, the light emitting layer is provided on a side of the anode layer away from the base substrate, and the cathode layer is provided on a side of the light emitting layer away from the base substrate.

13. The display substrate according to claim 12, wherein the light emitting layer further covers a surface of the recess; and the cathode layer is provided on an entire surface of the light emitting layer; and
the light blocking structure is formed by a portion of the cathode layer located in the recess.

14. A manufacturing method of a display substrate, comprising steps of:
providing a base substrate;
forming a thin film transistor on a side of the base substrate;
forming a planarization layer on a side of the base substrate on which the thin film transistor has been formed;
forming a recess at a side of the planarization layer away from the base substrate;
forming a light blocking structure in the recess;
forming a pixel defining layer on the planarization layer, the pixel defining layer defining a plurality of pixel regions;
forming a light emitting diode on a side of the planarization layer in a pixel region away from the base substrate,
wherein an orthographic projection of the pixel defining layer on the base substrate covers an orthographic projection of the thin film transistor on the base substrate, the recess is formed at a boundary between the pixel defining layer and the pixel region, and the recess is located between the thin film transistor and the light emitting diode in a direction parallel to the base substrate, and
the light blocking structure being configured to at least block light emitted from the light emitting diode from irradiating onto the thin film transistor.

15. The manufacturing method of the display substrate according to claim 14, wherein the step of forming the recess at the side of the planarization layer away from the base substrate comprises:
forming the recess that is continuously or discontinuously provided around the pixel region at the side of the planarization layer away from the base substrate.

16. The manufacturing method of the display substrate according to claim 14, wherein the step of forming the planarization layer on the side of the base substrate on which the thin film transistor has been formed comprises:
forming an entire film layer for the planarization film layer on the side of the base substrate on which the thin film transistor has been formed;
performing a patterning process on the entire film layer for the planarization layer by using a halftone mask to form a patterned planarization layer, and
the step of forming the recess at the side of the planarization layer away from the base substrate includes:
performing a patterning process on the patterned planarization layer by using a halftone mask to form the recess.

17. A manufacturing method of a display device, comprising the manufacturing method of the display substrate of claim 14.

18. The manufacturing method of the display substrate according to claim 14, wherein the step of forming the light emitting diode on the side of the pixel region away from the base substrate in the pixel region comprises:
forming an anode layer on a side of the planarization layer away from the base substrate;
forming a light emitting layer on a side of the anode layer away from the base substrate; and
forming a cathode layer on a side of the light emitting layer away from the base substrate.

19. The manufacturing method of the display substrate according to claim 18, wherein the step of forming the light blocking structure in the recess comprises:
forming the light emitting layer on a surface of the recess;
forming the cathode layer on a side of the light emitting layer in the recess away from the base substrate.

20. The manufacturing method of the display substrate according to claim 18, wherein the step of forming the light blocking structure in the recess comprises:
filling a light blocking material in the recess, a surface of the light blocking material exposed from the recess is flush with a surface of the planarization layer away from the base substrate, and
the step of forming the anode layer on the side of the planarization layer away from the base substrate comprises:
forming the anode layer to cover a surface of the planarization layer away from the base substrate and a surface of the light blocking material exposed from the recess.

* * * * *